*(12)* United States Patent
Arkun et al.

(10) Patent No.: US 8,823,025 B1
(45) Date of Patent: Sep. 2, 2014

(54) III-N MATERIAL GROWN ON AIO/AIN BUFFER ON SI SUBSTRATE

(71) Applicants: Erdem Arkun, San Carlos, CA (US);
 Michael Lebby, Apache Junction, AZ (US); Andrew Clark, Los Altos, CA (US); Rytis Dargis, Fremont, CA (US)

(72) Inventors: Erdem Arkun, San Carlos, CA (US);
 Michael Lebby, Apache Junction, AZ (US); Andrew Clark, Los Altos, CA (US); Rytis Dargis, Fremont, CA (US)

(73) Assignee: Translucent, Inc., Palo Alto, CA (US)

( * ) Notice: Subject to any disclaimer, the term of this patent is extended or adjusted under 35 U.S.C. 154(b) by 29 days.

(21) Appl. No.: 13/772,126

(22) Filed: Feb. 20, 2013

(51) Int. Cl.
 *H01L 33/00* (2010.01)
(52) U.S. Cl.
 USPC ............. 257/94; 257/E21.099; 257/E21.109; 257/E21.116; 257/E21.117; 257/E21.118; 257/E21.125; 257/E21.126; 257/E21.127; 438/46; 438/47; 438/479; 438/481
(58) Field of Classification Search
 USPC ................... 257/E21.099, E21.109, E21.116, 257/E21.117, E21.118, E21.125, E21.126, 257/E21.127, 94; 438/46, 47, 479, 481
 See application file for complete search history.

(56) References Cited

U.S. PATENT DOCUMENTS

| 7,619,238 B2 * | 11/2009 | Gaska et al. ................... 257/14 |
| 8,623,747 B1 * | 1/2014 | Arkun et al. .................. 438/481 |
| 8,633,569 B1 * | 1/2014 | Arkun et al. .................. 257/615 |
| 2008/0188065 A2 * | 8/2008 | Semond et al. ............... 438/492 |
| 2008/0203382 A1 * | 8/2008 | Yanagihara ..................... 257/18 |
| 2012/0299012 A1 * | 11/2012 | Resler et al. .................... 257/76 |
| 2013/0020581 A1 * | 1/2013 | Teraguchi et al. .............. 257/76 |

* cited by examiner

*Primary Examiner* — Asok K Sarkar
(74) *Attorney, Agent, or Firm* — Parsons & Goltry; Robert A. Parsons; Michael W. Goltry

(57) ABSTRACT

III-N material grown on a silicon substrate includes a single crystal buffer positioned on a silicon substrate. The buffer is substantially crystal lattice matched to the surface of the silicon substrate and includes aluminum oxynitride adjacent the substrate and aluminum nitride adjacent the upper surface. A first layer of III-N material is positioned on the upper surface of the buffer. An inter-layer of aluminum nitride (AlN) is positioned on the first III-N layer and an additional layer of III-N material is positioned on the inter-layer. The inter-layer of aluminum nitride and the additional layer of III-N material are repeated n-times to reduce or engineer strain in a final III-N layer.

18 Claims, 1 Drawing Sheet

III-N MATERIAL GROWN ON AlO/AlN BUFFER ON SI SUBSTRATE

FIELD OF THE INVENTION

This invention relates in general to the growth of III-N material on a silicon substrate and more specifically to the formation of an AlO/AlN buffer between the silicon substrate and GaN with thin AlN interlayers.

BACKGROUND OF THE INVENTION

In the semiconductor industry, it is known that growing a III-N material, such as GaN, on a silicon substrate is difficult due in large part to the large crystal lattice mismatch (−16.9%) and the thermal mismatch (53%) between silicon and GaN. Thus, some type of buffer layer or layers is generally formed on the silicon substrate and the III-N material is grown on the buffer layer. Generally, the prior art buffer layers are either complicated and expensive to form or do no adequately reduce the strain in the GaN due to crystal lattice mismatch.

It is also known that during much of the growth process there must ideally be no exposed silicon surface due to detrimental reaction between silicon and the various MBE process gasses, i.e. $N_2$ plasma, $NH_3$ and metallic Ga. Also in the case where other growth processes are used, such as MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors). Many of the prior art buffer schemes do not adequately protect the silicon substrate.

It would be highly advantageous, therefore, to remedy the foregoing and other deficiencies inherent in the prior art.

Accordingly, it is an object of the present invention to provide new and improved methods for the growth of III-N material on a silicon substrate.

It is another object of the present invention to provide new and improved methods for the growth of III-N material on a silicon substrate that includes eliminating or greatly reducing the problem of possible damage to the silicon substrate with process gasses.

It is another object of the present invention to provide new and improved III-N layers grown on a silicon substrate.

It is another object of the present invention to provide new and improved LED and/or HEMI structures formed on III-N layers on a silicon substrate.

SUMMARY OF THE INVENTION

Briefly, the desired objects and aspects of the instant invention are realized in accordance with a method of growing a III-N material on a silicon substrate. The method includes a single crystal buffer positioned on a silicon substrate. The buffer is substantially crystal lattice matched to the surface of the silicon substrate and includes aluminum oxynitride adjacent the substrate and aluminum nitride adjacent the upper surface. A first layer of III-N material is positioned on the upper surface of the buffer. An inter-layer of aluminum nitride (AlN) is positioned on the first III-N layer and an additional layer of III-N material is positioned on the inter-layer. The inter-layer of aluminum nitride and the additional layer of III-N material are repeated n-times to reduce or engineer strain in a final III-N layer.

The desired objects and aspects of the instant invention are further achieved in accordance with a preferred method of growing III-N material on a silicon substrate including a step of growing or depositing a single crystal buffer on a silicon substrate. The buffer is substantially crystal lattice matched to the surface of the silicon substrate and includes aluminum oxynitride adjacent the substrate and aluminum nitride adjacent the upper surface. The method further includes the steps of growing or depositing a first layer of III-N material on the surface of the rare earth oxide layer; growing or depositing an inter-layer of aluminum nitride (AlN) on the first layer of III-N material; and growing or depositing an additional layer of III-N material on the surface of the layer of aluminum nitride. The step of growing or depositing the inter-layer of aluminum nitride and the additional layer of III-N material are repeated n-times to reduce or engineer strain in a final III-N layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
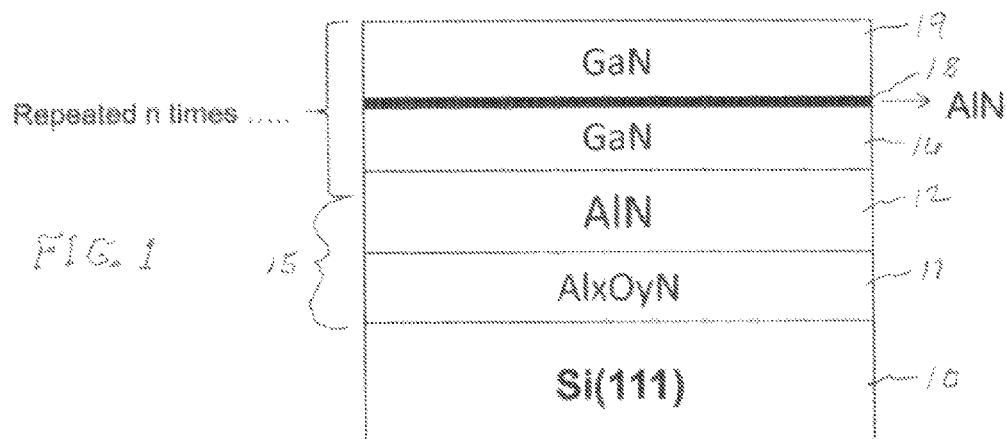
FIG. 1 is a simplified layer diagram illustrating a method of growing III-N material on a silicon substrate, in accordance with the present invention.

Turning to FIG. 1, a simplified layer diagram is illustrated representing several steps in a process of growing III-N material and in this preferred example GaN on a silicon substrate 10, in accordance with the present invention. It will be understood that substrate 10 is or may be a standard well known single crystal wafer or portion thereof generally known and used in the semiconductor industry. Single crystal substrates, it will be understood, are not limited to any specific crystal orientation but could include (111) silicon, (110) silicon, (100) silicon or any other orientation or variation known and used in the art. The Si (100) and (111) substrates could also include various miscuts with nominal value between 0 and 10° in any direction. However, throughout this disclosure substrate 10 is illustrated with a preferred (111) orientation because of the simplification of further operations.

A layer 11 of aluminum oxynitride ($Al_xO_yN$) is epitaxially grown on silicon substrate 10. Aluminum oxynitride has a crystal lattice spacing that can be substantially matched to silicon with very little strain. Further, the crystal lattice spacing of layer 11 can be varied by varying the composition of the aluminum oxynitride (e.g. varying y between 0 and 0.5), which allows for strain engineering of the silicon wafers. Generally, the aluminum oxynitride material closest to or adjacent silicon substrate 10 will have a larger y component which adjusts the crystal spacing closest to the crystal spacing of silicon while aluminum oxynitride material adjacent the opposite side of layer 11 will have a smaller y component. Also, aluminum oxynitride layer 11 can be formed with a single continuous composition or it can be graded, in linear, stepwise or any similar schemes.

It should be noted that aluminum oxide is impervious to MBE process gasses, i.e. $N_2$ plasma, $NH_3$ and metallic Ga, which is the preferred growth process in this invention. Also, in the event that other growth processes are used, such as the MOCVD process, the aluminum oxide is also impervious to MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors). Thus silicon substrate 10 is protected from damage caused by generally all growth process gasses by aluminum oxynitride layer 11.

A layer 12 of aluminum nitride (AlN) is epitaxially grown on aluminum oxynitride layer 11. Since the material of layer 11 adjacent the upper surface has or may have a smaller y component, the crystal spacing is closer to the crystal spacing of the AlN grown on the surface. In some applications it may be convenient for layers 11 and 12 to be formed as a single layer in which the oxygen (y component) varies from a maximum content adjacent silicon substrate 10 to zero adjacent the upper surface. Also, layers 11 and 12 can be formed as two single continuous compositions (generally as illustrated) or one or both can be graded, in linear, stepwise or any similar schemes. Aluminum oxynitride layer 11 and aluminum nitride layer 12 form a buffer 15 for the further epitaxial growth of III-N materials. The aluminum nitride in buffer 15 is closer to matching the crystal formation and lattice spacing of III-N materials, such as GaN, so that III-N materials can be epitaxially grown directly on buffer 15.

A III-N material, in this specific example gallium nitride (GaN) layer 16, is epitaxially grown on aluminum nitride layer 11 of buffer 15 preferably by an MBE process. Generally, GaN layer 16 will be in a range of 50 nm to 100 nm thick, although thicker or thinner layers can be grown. Because there will still be some strain in GaN layer 16, i.e. the crystal lattice junction with buffer 15 still produces some strain, a thinner layer 16 of GaN is preferred.

A thin inter-layer of aluminum nitride (AlN) 18 is epitaxially grown on GaN layer 16 to further reduce the strain. Preferably, AlN inter-layer 18 is in a range of approximately 1 nm to approximately 10 nm thick but for certain applications thicker or thinner films can be grown. Also, AlN inter-layer 18 can be grown using either a low or a high temperature process. A second layer 19 of GaN is epitaxially grown on AlN inter-layer 18. A second inter-layer of AlN is grown on second GaN layer 19 and this process is repeated n times or until the strain in the upper GaN layer has been reduced to an acceptable level. Basically, the strain formed during the growth of the GaN is controlled by insertion of the thin inter-layers of AlN, each of which allows the following layer of GaN to be under compressive stress due to the pseudomorphic growth at the interface. Repeating the process (i.e. the alternating growth of layers 18 and 19) n times can be used to further reduce or engineer strain in the final GaN or III-N layer. Also, it should be noted that since each additional layer of GaN grown on the next inter-layer of AlN has less strain, each additional layer can be grown thicker if desired.

Figure 2:
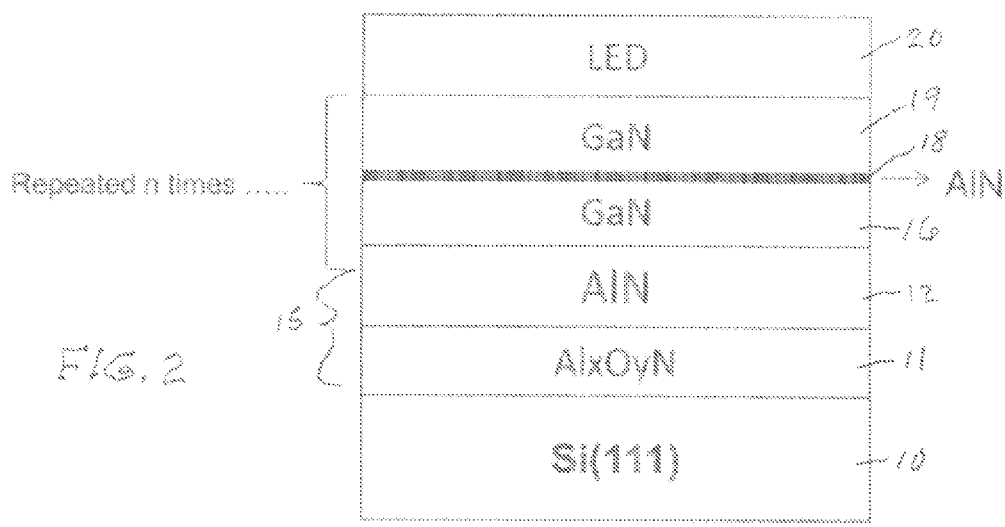
FIG. 2 is a simplified layer diagram of the III-N material on the silicon substrate of FIG. 1 with an LED structure formed thereon.

Turning to FIG. 2, buffer 15 GaN layer 16/AlN inter-layer 18/GaN layer 19 (repeated n times) is illustrated with a III-N LED structure 20 formed thereon. Structure 20 is illustrated as a single layer for convenience but it should be understood that III-N LED structure 20 includes the growth of one or more typical layers, including for example, i-GaN, n-GaN, active layers such as InGaN/GaN, electron blocking layers, p-GaN, and other inter-layers used in the formation and performance of LED (especially photonic LED) devices.

Figure 3:
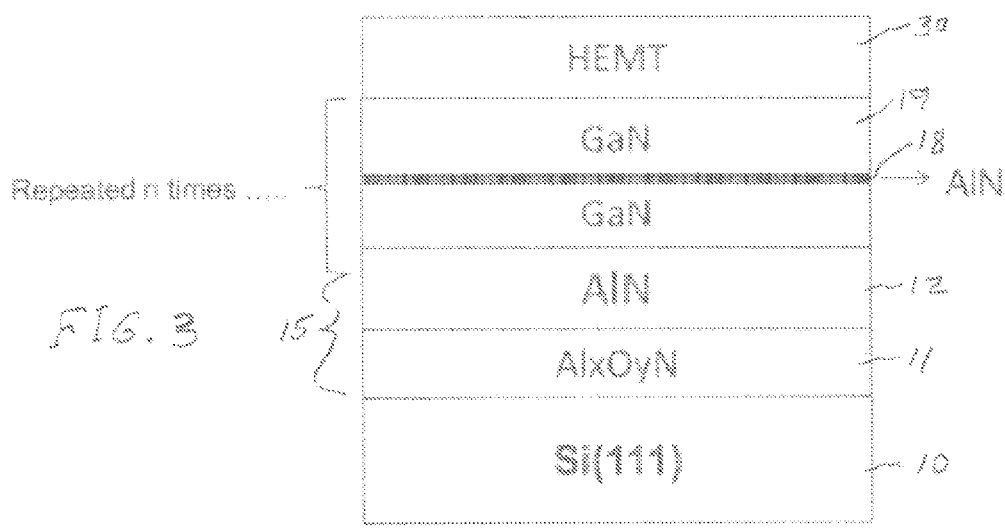
FIG. 3 is a simplified layer diagram of the GaN on the silicon substrate of FIG. 1 with an HEMT structure formed thereon.

Turning to FIG. 3, buffer 15, GaN layer 16/AlN inter-layer 18/GaN layer 19 (repeated n times) is illustrated with a HEMT structure 30 formed thereon. Structure 30 is illustrated as a single layer for convenience but it should be understood that HEMT structure 30 includes the growth of one or more typical layers, including for example, i-GaN, AlN, AlGaN, GaN, and other inter-layers used in the formation and performance of HEMT devices.

Thus, new and improved methods for the growth of III-N material and devices on a silicon substrate are disclosed. The new and improved methods for the III-N material include the growth of a substantially crystal lattice matching buffer on the silicon substrate and n repetitions of the growth of thin AlN inter-layers in the III-N material to further reduce or engineer the strain. Also, the buffer eliminates or greatly reduces the problem of possibly damaging the silicon substrate with process gasses. New and improved LED and/or HEMI structures can be substantially lattice matched and thermally matched by the new process on a silicon substrate.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. III-N material grown on a silicon substrate comprising:
a single crystal silicon substrate;
a single crystal buffer positioned on the silicon substrate, the single crystal buffer including aluminum oxynitride positioned adjacent the silicon substrate and aluminum nitride adjacent the upper surface, the single crystal buffer being substantially crystal lattice matched to the surface of the silicon substrate;
a first layer of III-N material positioned on the surface of the buffer; and
an inter-layer of aluminum nitride (AlN) positioned on the surface of the first layer of III-N material and an additional layer of III-N material positioned on the surface of the inter-layer of aluminum nitride, the inter-layer of aluminum nitride and the additional layer of III-N material repeated n-times to reduce or engineer strain in a final III-N layer.

2. The III-N material grown on the silicon substrate as claimed in claim 1 wherein the aluminum oxynitride and the aluminum nitride are one of graded to have smooth changes in the aluminum oxynitride and the aluminum nitride or stepped to have abrupt changes in the aluminum oxynitride and the aluminum nitride.

3. The III-N material grown on the silicon substrate as claimed in claim 1 wherein the layer of III-N material includes one of an LED structure and an HEMT structure.

4. The III-N material grown on the silicon substrate as claimed in claim 3 wherein the LED structure includes at least one layer of i-GaN, n-GaN, an active layer, an electron blocking layer, or p-GaN.

5. The III-N material grown on the silicon substrate as claimed in claim 3 wherein the HEMT structure includes at least one layer of i-GaN, AlN, AlGaN, or GaN.

6. The III-N material grown on the silicon substrate as claimed in claim 1 wherein the first layer of III-N material includes epitaxially grown gallium nitride.

7. A method of growing III-N material on a silicon substrate comprising the steps of:
providing a single crystal silicon substrate;
growing or depositing a buffer on the silicon substrate, the buffer including single crystal aluminum oxynitride adjacent the silicon substrate and aluminum nitride adjacent an upper surface of the buffer, the aluminum oxynitride being substantially crystal lattice matched to the surface of the silicon substrate;

growing or depositing a first layer of III-N material on the upper surface of the buffer;

growing or depositing an inter-layer of aluminum nitride (AlN) on the first layer of III-N material;

growing or depositing an additional layer of III-N material on the surface of the layer of aluminum nitride; and repeating the steps of growing or depositing the inter-layer of aluminum nitride and the additional layer of III-N material n-times to reduce or engineer strain in a final III-N layer.

8. The method as claimed in claim 7 wherein the step of growing or depositing the buffer includes growing or depositing a single crystal layer of aluminum oxynitride on the silicon substrate, the aluminum oxynitride layer being substantially crystal lattice matched to the surface of the silicon substrate and growing or depositing a single crystal layer of aluminum nitride on the layer of aluminum oxynitride, the aluminum nitride layer being substantially crystal lattice matched to the surface of the aluminum oxynitride.

9. The method as claimed in claim 7 wherein the aluminum oxynitride and the aluminum nitride are epitaxially grown in a continuous process including one of graded to have smooth changes in the aluminum oxynitride and the aluminum nitride or stepped to have abrupt changes in the aluminum oxynitride and the aluminum nitride.

10. The method as claimed in claim 7 wherein the step of growing or depositing the first layer of III-N material includes depositing a layer of gallium nitride with a thickness in a range of approximately 50 nm to approximately 100 nm thick.

11. The method as claimed in claim 7 wherein the step of growing or depositing the inter-layer of aluminum nitride includes depositing a layer in a range of approximately 1 nm to approximately 10 nm thick.

12. The method as claimed in claim 7 wherein the step of growing or depositing the final layer of III-N material includes growing or depositing an LED structure on the final layer of III-N material.

13. The method as claimed in claim 12 wherein the step of growing the LED structure on the final layer of III-N material includes growing at least one layer including one of i-GaN, n-GaN, active layers, electron blocking layers, or p-GaN.

14. The method as claimed in claim 7 wherein the step of growing or depositing the final layer of III-N material includes growing an HEMT structure on the final layer of III-N material.

15. The method as claimed in claim 14 wherein the step of growing the HEMT structure on the final layer of III-N material includes growing at least one layer including one of, i-GaN, AlN, AlGaN, or GaN.

16. A method of growing III-N material on a silicon substrate comprising the steps of:

providing a single crystal silicon substrate;

epitaxially depositing a buffer on the silicon substrate, the buffer including single crystal aluminum oxynitride adjacent the silicon substrate and aluminum nitride adjacent an upper surface of the buffer, the aluminum oxynitride being substantially crystal lattice matched to the surface of the silicon substrate;

epitaxially depositing a first layer of GaN on the upper surface of the buffer;

epitaxially depositing an inter-layer of aluminum nitride (AlN) on the first GaN layer;

epitaxially depositing an additional layer of GaN on the surface of the aluminum nitride inter-layer;

repeating the steps of epitaxially depositing the inter-layer of aluminum nitride and the additional layer of GaN n-times to reduce or engineer strain in each subsequent additional layer of GaN to reduce or engineer strain in a final GaN layer; and epitaxially depositing a III-N layer on the final GaN layer, the III-N layer including one of an LED structure and an HEMI structure.

17. A method as claimed in claim 16 wherein the step of epitaxially depositing the buffer includes epitaxially growing the aluminum oxynitride and the aluminum nitride in a continuous process including one of graded to have smooth changes in the aluminum oxynitride and the aluminum nitride or stepped to have abrupt changes in the aluminum oxynitride and the aluminum nitride.

18. The method as claimed in claim 16 wherein the step of epitaxially depositing the buffer includes growing or depositing a single crystal layer of aluminum oxynitride on the silicon substrate, the aluminum oxynitride layer being substantially crystal lattice matched to the surface of the silicon substrate and growing or depositing a single crystal layer of aluminum nitride on the layer of aluminum oxynitride, the aluminum nitride layer being substantially crystal lattice matched to the surface of the aluminum oxynitride.

* * * * *